United States Patent
Veysset et al.

(10) Patent No.: US 7,149,513 B2
(45) Date of Patent: Dec. 12, 2006

(54) PROCESS FOR ANALYSING THE AMBIENT ELECTROMAGNETIC FIELD AND ASSOCIATED PORTABLE DEVICE

(75) Inventors: Rémy Veysset, Viroflay (FR); Sébastien Chauvin, Rocquencourt (FR); Dominique Picard, Bonnelles (FR); Gilles Fleury, Paris (FR); Laurent Le Brusquet, Paris (FR)

(73) Assignee: Bouygues Telecom, Boulogne Billancourt (FR)

( * ) Notice: Subject to any disclaimer, the term of this patent is extended or adjusted under 35 U.S.C. 154(b) by 466 days.

(21) Appl. No.: 10/195,052

(22) Filed: Jul. 11, 2002

(65) Prior Publication Data

US 2003/0064721 A1 Apr. 3, 2003

(30) Foreign Application Priority Data

Jul. 12, 2001 (FR) ................................... 01 09314

(51) Int. Cl.
*H04Q 7/20* (2006.01)
(52) U.S. Cl. ...................... 455/424; 375/346; 375/347
(58) Field of Classification Search ........ 455/423–424, 455/522, 67.11, 67.15, 67.16, 115.1–115.4, 455/226.1–226.4; 375/346, 347
See application file for complete search history.

(56) References Cited

U.S. PATENT DOCUMENTS

| | | | | |
|---|---|---|---|---|
| 6,097,771 A | * | 8/2000 | Foschini | ...................... 375/346 |
| 6,131,038 A | * | 10/2000 | Sekine | ........................ 455/513 |
| 6,600,796 B1 | * | 7/2003 | Hassibi | ........................ 375/347 |
| 7,042,224 B1 | * | 5/2006 | Fujiwara | ...................... 324/337 |
| 2003/0064721 A1 | * | 4/2003 | Veysset et al. | .............. 455/424 |

FOREIGN PATENT DOCUMENTS

WO    WO 01 46705 A    6/2001

* cited by examiner

*Primary Examiner*—Duc Nguyen
*Assistant Examiner*—Michael Vu
(74) *Attorney, Agent, or Firm*—Blakely Sokoloff Taylor & Zafman

(57) ABSTRACT

The invention relates to a process for analysing the ambient electromagnetic field in which, to determine the field level of one or more cellular telecommunication networks, the field is analysed at the frequencies of the beacon pathways of base stations of the network or networks, characterized in that it comprises the steps according to which:
- with the aid of detection means (4), the intensity of the electromagnetic field is measured over time for several frequencies of a frequency range which is sampled,
- a processing unit (1) determines for each frequency, from the measurements thus performed, at least one characteristic parameter of the electromagnetic field,
- the processing unit (1) determines from the values of this characteristic parameter, the frequencies which correspond to the signals of the beacon pathways of one or more base stations, by applying a selection criterion based on the statistical properties of the field radiated by this type of station.

13 Claims, 2 Drawing Sheets

Figure 1:
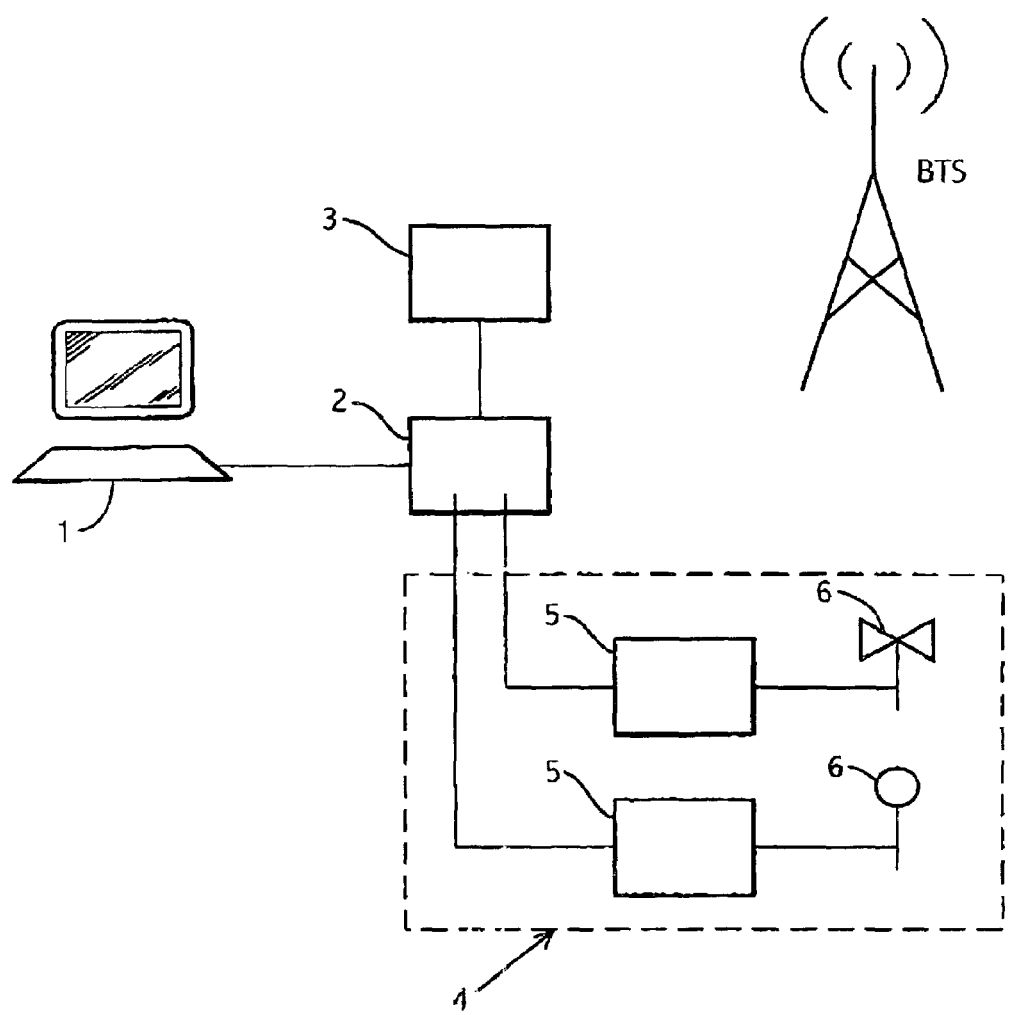

PROCESS FOR ANALYSING THE AMBIENT ELECTROMAGNETIC FIELD AND ASSOCIATED PORTABLE DEVICE

The invention relates to measurements of ambient electromagnetic radiation, and in particular of radiation generated by the beacon pathways of base stations (BTS) of cellular telephony networks.

It finds in particular—but non limitingly—advantageously application to the measurements of radiation of GSM or DCS networks.

The burgeoning of electrical and electronic appliances such as household appliances, televisions and mobile telephones has led to an increase in the electromagnetic radiation in ambient space. The influence of this radiation on the body is still poorly known. Nevertheless, the Agence Nationale des Fréquences (ANFR) [National Agency for Frequencies] has published—before the priority date of the present patent application—an interim document aimed at establishing a "Protocol for in-situ measurement" of electromagnetic emissions for field levels of between 9 kHz and 300 GHz. A finalized document has more recently been made accessible.

This document goes back to reference levels of the electric field and of the magnetic field which were laid down, for various frequency ranges, in a "recommendation of the Council of the European Union" of 12 Jul. 1999 relating to the limiting of the exposure of the public to electromagnetic fields (Act published in the Official Journal of the European Communities of 30 Jul. 1999). In France, these reference levels were also the subject of Decree 2002-775 of 3 May 2002.

The document WO 01/46705 proposes a device for analysing the ambient electromagnetic field comprising a module for measuring the field linked to a spectrum analyser and a control and processing unit including a microcomputer. The control and processing unit calculates, from the data recorded by the spectrum analyser, a value of mean effective component of electric or magnetic field. For each sampling frequency, this value is compared with a threshold value.

Such a device does not make it possible to distinguish, within the ambient electromagnetic radiation, the radiation emitted by base stations of a cellular network. Consequently, it does not make it possible to determine whether a high level of ambient electromagnetic radiation is or is not due to the proximity of these base stations.

To detect the emissions generated by the base stations, the techniques currently used consist in rapidly scrolling through a series of traces acquired by a spectrum analyser. The frequencies corresponding to the beacon pathways of the base stations are spotted by virtue of retinal persistence; they are in fact notable through their property of small temporal variation and their relatively sizeable intensity level.

Such a technique can be used only by experienced operators and leads to a low detection rate (<50%) and to an unacceptable detection error rate (>50%).

The aim of the invention is to provide a tool allowing the automatic detection of the frequencies of the beacon pathways of the base stations of a cellular network, so as to allow a determination of the level of the fields radiated by the base stations.

To this end, the invention proposes a process for analysing the ambient electromagnetic field in which, to determine the field level of one or more cellular telecommunication networks, the field is analysed at the frequencies of the beacon pathways of base stations of the network or networks, characterized in that it comprises the steps according to which:

with the aid of detection means, the intensity of the electromagnetic field is measured over time for several frequencies of a frequency range which is sampled, a processing unit determines for each frequency, from the measurements thus performed, at least one characteristic parameter of the electromagnetic field, the processing unit determines from the values of this characteristic parameter, the frequencies which correspond to the signals of the beacon pathways of one or more base stations, by applying a selection criterion based on the statistical properties of the field radiated by this type of station.

This process advantageously makes it possible to measure the intensity of the radiation emitted by the base stations of a cellular telecommunication network. These intensities can then be compared, after extrapolation to maximum traffic, with threshold values, corresponding for example to the reference levels fixed by the regulatory texts.

The intensity of the electromagnetic field can be determined from the measurement of the magnetic field and/or of the electric field.

Preferably, one of the characteristic parameters determined is chosen from the following parameters: the mean intensity of the electromagnetic field, the standard deviation of the variation in the intensity of the electromagnetic field, the period of variation of the electromagnetic field, the minimum intensity of the electromagnetic field, the half-sum of quartiles 1 and 3 of the intensity of the electromagnetic field, the difference between quartile 2 and the discrepancy between quartiles 1 and 3 of the intensity of the electromagnetic field.

In one implementation of the invention, for a given frequency, a relevant characteristic parameter is the median, and the frequencies of the base stations of a cellular telecommunication network are determined by taking into consideration those for which the median is a maximum.

In another implementation of the invention, for a given frequency, a relevant characteristic parameter is the mean intensity of the electromagnetic field at this frequency, and the processing unit determines the frequencies of the beacon pathways of the base stations of a cellular telecommunication network by taking into consideration those for which the mean intensity is a maximum.

This implementation advantageously makes it possible to detect the levels of electromagnetic fields generated by the closest base stations.

In another implementation of the invention, for a given frequency, a relevant characteristic parameter is the standard deviation of the variation in the intensity of the electromagnetic field measured at this frequency, and the processing unit determines the frequencies of the beacon pathways of the base stations of a cellular telecommunication network by taking into consideration those for which the normalized standard deviation is a minimum.

In another implementation, for a given frequency, a relevant characteristic parameter is the period of variation of the electromagnetic field at this frequency, and the processing unit determines the frequencies of the beacon pathways of the base stations of a cellular telecommunication network by taking into consideration those for which the intensity of the signal exhibits a periodic variation.

In another implementation of the invention, for a given frequency, a relevant characteristic parameter is the minimum intensity of the electromagnetic field at this frequency, and the processing unit determines the frequencies of the beacon pathways of the base stations of a cellular telecommunication network by taking into consideration those for which the minimum intensity is a maximum.

In another implementation of the invention, for a given frequency, a relevant characteristic parameter is the half-sum of quartiles 1 and 3 of the intensity of the electromagnetic field, and the processing unit determines the frequencies of the beacon pathways of the base stations of a cellular telecommunication network by taking into consideration those for which this half-sum of quartiles 1 and 3 is a maximum.

In another implementation of the invention, for a given frequency, a relevant characteristic parameter is the difference between quartile 2 and the discrepancy between quartiles 1 and 3 of the intensity of the electromagnetic field, and the processing unit determines the frequencies of the beacon pathways of the base stations of a cellular telecommunication network by taking into consideration those for which the difference between quartile 2 and the discrepancy between quartiles 1 and 3 is a maximum.

In another implementation of the invention, for a given frequency, the processing unit determines at least two characteristic parameters and constructs a Pareto diagram including for each sampling frequency a point representative of these parameters, the processing unit then selects the points situated in a zone of the diagram in which base stations are located.

Advantageously, characteristic parameters represented on the Pareto diagram can be the mean intensity of the electromagnetic field and the standard deviation of the variation in the intensity of the electromagnetic field.

Advantageously, characteristic parameters represented on the Pareto diagram can be quartile 2 of the intensity of the electromagnetic field and the difference of quartiles 1 and 3 of the intensity of the electromagnetic field.

Finally, the processing unit compares the levels of intensity of the electromagnetic field measured at the frequencies of the selected base stations with reference values.

The invention also relates to a portable device for analysing the ambient electromagnetic field, characterized in that it comprises means of detection of the electromagnetic field, a spectrum analyser which is linked to these means of detection and which analyses the spectrum of the electromagnetic field detected, and a processing unit able to implement the analysis process defined above on the basis of the measurements provided by the spectrum analyser.

This device advantageously makes it possible to carry out measurements of electromagnetic field at the geographical point at which one wishes to ascertain the intensity of the ambient electromagnetic radiation.

In one implementation of this device, the means of detection comprise at least two antennas, the bandwidth of the one extending from 20 Hz to 1 MHz, the bandwith of the other extending from 80 MHz to 3 GHz.

Advantageously, in particular, the means of detection comprise at least one third antenna whose bandwidth extends between 1 and 80 MHz.

Figure 2:
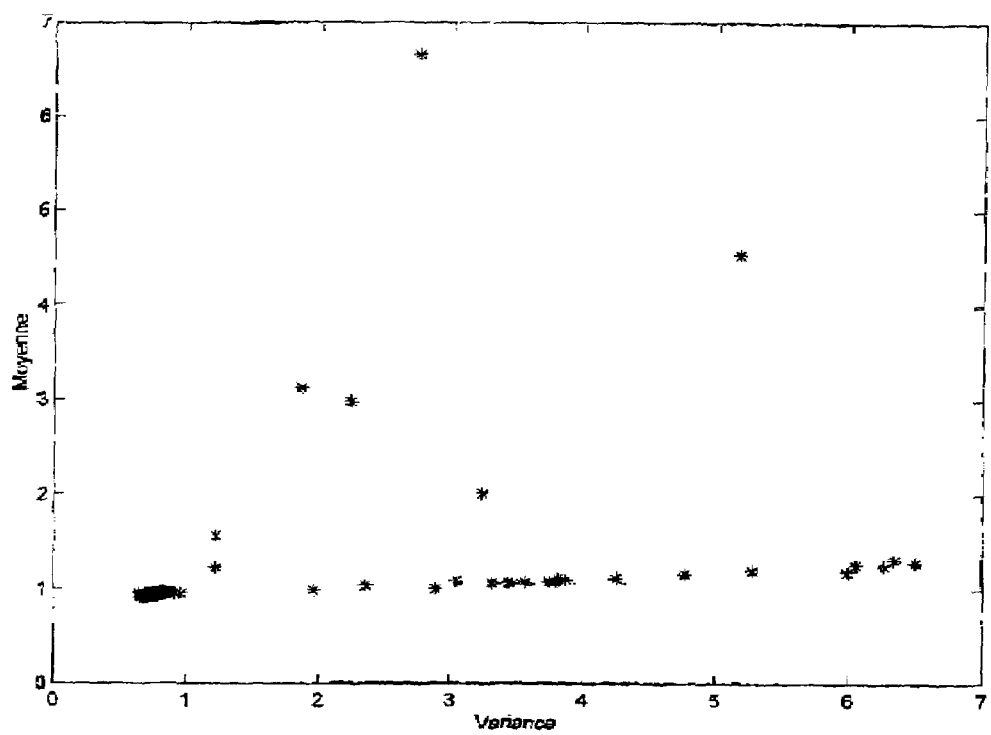

Other characteristics and advantages will become further apparent from the description which follows, which is purely illustrative and nonlimiting and should be read in conjunction with the appended figures among which:

FIG. 1 represents a device for detecting the electromagnetic field in accordance with an embodiment of the invention, FIG. 2 represents the mean/standard deviation Pareto diagram, obtained for a series of measurements and used in a mode of implementation of the process of the invention.

The base stations (BTS) regularly transmit locating information to the mobile stations on the "broadcasting channel" (BCCH). The power emitted by these base stations is quasi-constant so that a mobile station can be located as a function of the power level which it receives. Thus, the ambient electromagnetic radiation is greater in proximity to base stations.

In FIG. 1, the device for detecting the electromagnetic field comprises a portable PC 1 comprising monitoring software and processing means, which is connected to a spectrum analyser 2. The spectrum analyser 2 may for example be of the HP 8560EC type provided by the Hewlett Packard company. It is linked to stand-alone supply means 3. The device moreover comprises means of detection 4 which can be connected to the spectrum analyser 2. The means of detection 4 used depend on the frequency ranges which one wishes to analyse. These means of detection comprise amplifiers 5 each associated with an antenna 6. The antennas 6 are disposed precisely where one wishes to ascertain the electromagnetic field.

For the detection of frequencies lying between 10 Hz and 1 MHz, use is for example made of a 7604 loop antenna 13 cm in diameter provided by Electrometrics and associated with an HP 11729-60014 low-frequency amplifier provided by Hewlett Packard. For the detection of the frequencies lying between 80 MHz and 2900 MHz, use is made of an HP 87405A high-frequency amplifier provided by Hewlett Packard and associated with an ARC PCD8250 biconical antenna.

For the detection of frequencies lying between 1 MHz and 80 MHz, use is made of a third antenna which is for example a SCHWARZBECK 1545 antenna.

The "reference exposure levels" to which the ANFR refers allow comparison with the measured values of electric field and magnetic field. These reference levels are given for each frequency range between 0 and 300 GHz in Table 1:

TABLE 1

Reference values advocated in the recommendation of the Council of the European Union of 12 Jul. 1999 relating to the limiting of the exposure of the public to electromagnetic fields (from 0 to 300 GHz).

| Frequency range | | Electric field E(V/m) | Magnetic field |
|---|---|---|---|
| 0 to 1 | Hz | | 32 000 |
| 1 to 8 | Hz | 10 000 | $32000/f^2$ |
| 8 to 25 | Hz | 10 000 | $4000/f$ |
| 0.025 to 0.8 | kHz | $250/f$ | $4/f$ |
| 0.8 to 3 | kHz | $250/f$ | 5 |
| 3 to 150 | kHz | 87 | 5 |
| 0.15 to 1 | MHz | 87 | $0.73/f$ |
| 1 to 10 | MHz | $87/f^{1/2}$ | $0.73/f$ |
| 10 to 400 | MHz | 28 | 0.073 |
| 400 to 2000 | MHz | $1.375 \times f^{1/2}$ | $0.0037 \times f^{1/2}$ |
| 2 to 300 | GHz | 61 | 0.16 |

$f$ is the frequency at which the field is measured considered in the unit indicated in the frequency range column.

For a previously defined frequency range, a number n of acquisitions is carried out, staggered over time. For this purpose, the antenna 6 appropriate to the frequencies to be detected is installed. The information necessary for defining this range is input with the aid of the PC 1. The monitoring software searches through a file for the configuration parameters of the spectrum analyser 2 and configures it accordingly. The software then orders the spectrum analyser to acquire the n spectral traces. The measurement data are recorded in a new file.

After having carried out the measurements using the various antennas over the set of frequency ranges, the user orders the analysis of the total spectrum obtained. The processing means make it possible to detect over this band, from these n acquisitions, the frequencies $f_{BCCH}$ of the BCCH signals and their intensity $E_{BCCH}$.

The selection of the BCCH frequencies is based on the fact that the BCCH signals are transmitted by the base stations with a quasi-constant power which is relatively high (with respect to the transmission powers of the communication channels when idle).

These qualitative properties make it possible to distinguish the signals transmitted by the base stations from the ambient noise and more especially from the signals corresponding to the idle communication channels or to the working communication channels. Specifically, the idle communication channels exhibit a low temporal fluctuation but a modestly high intensity level. The working communication channels may exhibit high intensity levels (when they are much invoked) but exhibit considerable temporal fluctuation.

The detection process consists in selecting from the sampled frequencies, those which most probably correspond to the BCCH signals. For this purpose, the processing means determine for each sampled frequency a characteristic parameter of the electromagnetic field at this frequency and select certain frequencies by applying discrimination criteria taking into account the properties of the hereinabove BCCH frequencies.

Criterion of the Maximum of the Minima (Maximin)

In a first implementation of the detection process, the control software orders the spectrum analyser to acquire n spectral traces in various frequency ranges. For each frequency $f_i$ sampled, the processing means determine the minimum intensity $(E_i)_{min}$ measured over the set of traces $(E_i)_j$ at this frequency $f_i$. The $E_{BCCH}$ intensities corresponding to the BCCH signals are regarded as being the intensities $(E_i)_{min}$ exhibiting maximum values.

Thus, according to this fourth implementation, we have:

$$(E_i)_{min} = \min_j ((E_i)_j)$$

$$E_{BCCH} = \max_i ((E_i)_{min})$$

$$f_{BCCH} = f(E_{BCCH})$$

The Maximin criterion gives fairly reliable results even though it does not always make it possible to detect low-level base stations. This result is due to the fact that a channel is now represented only by its minimum. Consequently, the signal merely needs to pass once through the mean noise level in order for it to no longer be regarded as a potential base station.

Criterion of the Maximum of the Medians (Maximed)

Instead of considering the minima of the intensities emitted for each sampled frequency, it is possible to choose to consider the median <Q2> of the values plotted over the set of traces. Specifically, the median constitutes a criterion which is more resistant to errors or excesses which may occur in the extremal values. Thus, according to this fifth implementation, we have:

$$\langle E_i \rangle = \frac{1}{n} \sum_{j=1}^{n} (E_i)_j$$

$$\langle E_{BCCH} \rangle = \max_i (\langle E_i \rangle)$$

$$f_{BCCH} = f(E_{BCCH})$$

The Maximed criterion is reliable, and, with this criterion, the risk of considering communication channels to be base stations is extremely low.

Criterion of the Minimum Normalized Standard Deviations

In a third implementation of the detection process, the software orders the spectrum analyser to acquire n spectral traces in the various frequency ranges. The processing means determine the standard deviation $\sigma_i$ of the intensities $E_i$ for each sampled frequency $f_i$ of the total spectrum. The intensities $E_{BCCH}$ corresponding to the BCCH signals are regarded as being the intensities exhibiting the lowest normalized standard deviations. (The expression "normalized" standard deviation is understood to be the ratio between the standard deviation and the mean intensity). Specifically, the BCCH signals are transmitted at a quasi-constant power.

Thus, according to this second implementation, we have:

$$\langle E_i \rangle = \frac{1}{n} \sum_{j=1}^{n} (E_i)_j$$

$$\sigma_i = \sqrt{\frac{1}{n} \sum_{j=1}^{n} ((E_i)_j - \langle E_i \rangle)^2}$$

$$E_{BCCH} = E\left(\min_i (\sigma_i)\right)$$

$$f_{BCCH} = f(E_{BCCH})$$

Criterion of Periodic Signals

In a fourth implementation of the detection process, the control software orders the spectrum analyser to acquire n spectral traces in the various frequency ranges. The n spectral traces are acquired with a fixed time interval between each acquisition j. For each frequency $f_i$ sampled, the processing means determine the period $T_i$ of variation of the measured intensity values $E_i$. The BCCH signals are periodic signals, thereby making it possible to differentiate them from the other signals.

Thus, according to this third implementation, we have:

$$T_i = \text{période}((E_i)_j) \text{ such that } T_i > 1/f_i$$

Criterion of the Half-Sum of the Quartiles

In a fifth implementation of the detection process, the control software orders the spectrum analyser to acquire n spectral traces in the various frequency ranges. For each frequency $f_i$ sampled, the processing means determine the values of quartiles 1, 2 and 3, denoted $E_{Q1}$, $E_{Q2}$ and $E_{Q3}$ respectively, of the measured intensities.

Quartile 1, denoted $E_{Q1}$ is defined as the intensity value for which a quarter of the measurements is less than or equal to this value.

Quartile 2, denoted $E_{Q2}$ is defined as the intensity value for which half of the measurements is less than or equal to this value; quartile 2 corresponds to the median.

Quartile 3, denoted $E_{Q3}$ is defined as the intensity value for which three quarters of the measurements is less than or equal to this value.

The difference between quartiles $E_{Q3}$ and $E_{Q1}$ provides an estimate of the standard deviation of the intensity values measured at the frequency $f_i$.

The half-sum of quartiles $E_{Q3}$ and $E_{Q1}$ provides an estimate of the mean value of the intensities measured at the frequency $f_i$.

The intensities $E_{BCCH}$ corresponding to the BCCH signals are regarded as being the intensities ($E_i$) for which the half-sum $S_i$ of the quartiles $E_{Q1}$ and $E_{Q3}$ is a maximum.

Thus, according to this fifth implementation, we have:

$$S_i = \frac{1}{2}(E_{Q1}(f_i) + E_{Q2}(f_i))$$

$$S_k = \max_i(S_i)$$

$$f_{BCCH} = f_k$$

This criterion exhibits great similarity with the criterion of the maximum of the medians (Maximed). However, it allows for less confusion between the communication channels invoked and the frequencies transmitted by the base stations.

Criterion of the Maximum of the Difference between Mean and Quartiles

In a sixth implementation of the detection process, the control software orders the spectrum analyser to acquire n spectral traces in the various frequency ranges. For each frequency $f_i$ sampled, the processing means determine the values of quartiles $E_{Q1}$, $E_{Q2}$, $E_{Q3}$ of the measured intensities.

The intensities $E_{BCCH}$ corresponding to the BCCH signals are regarded as being the intensities ($E_i$) for which the difference $D_i$ between quartile $E_{Q2}$ and the discrepancy between quartiles $E_{Q1}$ and $E_{Q3}$ is a maximum.

Thus, according to this seventh implementation, we have:

$$D_i = E_{Q2} - (E_{Q3} - E_{Q1})$$

$$D_k = \max_i(D_i)$$

$$f_{BCCH} = f_k$$

Pareto Criterion

In a seventh implementation, the processing means compute the Pareto diagram for at least two characteristic parameters. FIG. 2 represents an exemplary mean/standard deviation Pareto diagram. Each point $P_i$ represented in this diagram corresponds to a sampling frequency $f_i$. The abscissa and the ordinate of this point $P_i$ are respectively the standard deviation $\sigma_i$ and the mean $<E_i>$ of the values of the intensities $E_i$ measured at this frequency.

Thus, according to this seventh implementation we have:

$$P_i(\sigma_i, <E_i>)$$

The signals liable to be regarded as base stations are situated in a zone corresponding to an upper left portion of the Pareto diagram.

The processing means can of course produce Pareto diagrams by combining other characteristic parameters such as for example the difference of the quartiles $E_{Q3} - E_{Q1}$ and the mean $E_{Q2}$. In this case, the signals liable to be regarded as base stations are also situated in a zone corresponding to an upper left portion of the Pareto diagram.

The processing described previously has been applied to n=20 traces acquired at different geographical sites for 601 sampling frequencies uniformly distributed over the DCS (Digital Communication System) frequency range lying between 1.8 GHz and 1.88 GHZ. The results are indicated in table 2 below.

TABLE 2

Rate of correct detection obtained (β) and the error rate (Z) (communication channels detected as base stations) for various criteria used.

|   | Maximin | Maximed | $\frac{1}{2}(E_{Q1} + E_{Q3})$ | $E_{Q2} - (E_{Q3} - E_{Q1})$ | Pareto $(\sigma, <E>)$ | Pareto $(E_{Q3} - E_{Q1}, E_{Q2})$ |
|---|---|---|---|---|---|---|
| β | ~96% | ~97.5% | ~98% | ~97.5% | ~89% | ~85% |
| Z | 4.5% | 3% | 6% | 5% | 7% | 12% |

It is found that the rates of correct detection P are much greater than the rates obtained with the detection processes of the prior art (these rates were less than 50%). Moreover, the error rates Z are less than the error rates of the detection processes of the prior art.

The detection process proposed hereinabove is especially suited to fast on-site analysis of the ambient electromagnetic field. Specifically, it makes it possible to obtain reliable results from a restricted number of acquisitions (for example n=20).

Of course, it is possible to determine other characteristic parameters from the measured intensity values $E_i$ and to apply other criteria to these parameters, these criteria having to be based on the properties of the field radiated by the base stations.

For the frequencies $f_{BCCH}$ of the base stations thus determined, the processing means compare the maximum intensity levels of the electromagnetic field measured at the frequencies of the base stations determined with the reference values proposed for example in Table 1. Provision may be made for the PC 1 to display the result of this comparison graphically so that the user can immediately view the frequencies of the beacon pathways of the base stations for which the reference electromagnetic field levels are exceeded.

The invention claimed is:

1. Process for analysing the ambient electromagnetic field in which, to determine the field level of one or more cellular telecommunication networks, the process comprising the steps according to which:

with the aid of detection means (4), the intensity of the electromagnetic field is measured over time for several frequencies of a frequency range which is sampled, a processing unit (1) determines for each frequency, from the measurements thus performed, at least one characteristic parameter of the electromagnetic field, the processing unit (1) determines from the values of this characteristic parameter, the frequencies which correspond to the signals of beacon pathways of at least one base station, by applying a selection criterion based on statistical properties of the field radiated on the beacon pathways; and wherein one of the characteristic parameters determined is chosen from the following parameters: the mean intensity of the electromagnetic field, the standard deviation of the variation in the intensity of the electromagnetic field, the period of variation of the electromagnetic field, the minimum intensity of the electromagnetic field, the half-sum of quartiles 1 and 3 of the intensity of the electromagnetic field, the difference between quartile 2 and the discrepancy between quartiles 1 and 3 of the intensity of the electromagnetic field.

2. Process according to claim 1, wherein the intensity of the electromagnetic field is determined from the measurement of the magnetic field and/or of the electric field.

3. Process according to, claim 2 or claim 1 wherein, for a given frequency, a relevant characteristic parameter is the mean intensity of the electromagnetic field at this frequency, and wherein the frequencies of the beacon pathways of the base stations of a cellular telecommunication network are determined by taking into consideration those for which the mean intensity is a maximum.

4. Process according to, claim 2 or claim 1 wherein, for a given frequency, a relevant characteristic parameter is the standard deviation of the variation in the intensity of the electromagnetic field measured at this frequency, and wherein the frequencies of the beacon pathways of the base stations of a cellular telecommunication network are determined by taking into consideration those for which the normalized standard deviation is a minimum.

5. Process according to claim 2, or claim 1 wherein, for a given frequency, a relevant characteristic parameter is the period of variation of the electromagnetic field at this frequency, and wherein the frequencies of the beacon pathways of the base stations of a cellular telecommunication network are determined by taking into consideration those for which the intensity of the signal exhibits a periodic variation.

6. Process according to, claim 2 or claim 1 wherein, for a given frequency, a relevant characteristic parameter is the minimum intensity of the electromagnetic field at this frequency, and wherein the frequencies of the beacon pathways of the base stations of a cellular telecommunication network are determined by taking into consideration those for which the minimum intensity is a maximum.

7. Process according to, claim 2 or claim 1 wherein, for a given frequency, a relevant characteristic parameter is the median, and wherein the frequencies of the beacon pathways of the base stations of a cellular telecommunication network are determined by taking into consideration those for which the median is a maximum.

8. Process according to, claim 2 or claim 1 wherein, for a given frequency, a relevant characteristic parameter is the half-sum of quartiles 1 and 3 of the intensity of the electromagnetic field, and wherein the frequencies of the beacon pathways of the base stations of a cellular telecommunication network are determined by taking into consideration those for which this half-sum of quartiles 1 and 3 is a maximum.

9. Process according to, claim 2 or claim 1 wherein, for a given frequency, a relevant characteristic parameter is the difference between quartile 2 and the discrepancy between quartiles 1 and 3 of the intensity of the electromagnetic field, and wherein the frequencies of the beacon pathways of the base stations of a cellular telecommunication network are determined by taking into consideration those for which the difference between quartile 2 and the discrepancy between quartiles 1 and 3 is a maximum.

10. Process according to, claim 2 or claim 1 wherein, for a given frequency, the processing unit (1) determines at least two characteristic parameters and constructs a Pareto diagram including for each sampling frequency a point representative of these parameters, the processing unit (1) then selects the points situated in a zone of the diagram in which beacon pathways of base stations are location.

11. Process according to claim 9, wherein characteristic parameters represented on the Pareto diagram are the mean intensity of the electromagnetic field and the standard deviation of the variation in the intensity of the electromagnetic field.

12. Process according to claim 9, wherein characteristic parameters represented on the Pareto diagram are quartile 2 of the intensity of the electromagnetic field and the difference of quartiles 1 and 3 of the intensity of the electromagnetic field.

13. Process according to claim 1, wherein the processing unit (1) compares the levels of intensity of the electromagnetic field measured at the frequencies of the selected base stations with reference values.

* * * * *